(12) United States Patent
Ware et al.

(10) Patent No.: US 9,772,380 B2
(45) Date of Patent: Sep. 26, 2017

(54) CIRCUIT BREAKER SENSOR

(71) Applicant: SCHNEIDER ELECTRIC IT CORPORATION, West Kingston, RI (US)

(72) Inventors: Gary R. Ware, Newton, MA (US); Stephen Paul Linder, Medford, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 99 days.

(21) Appl. No.: 14/703,076

(22) Filed: May 4, 2015

(65) Prior Publication Data

US 2016/0327611 A1 Nov. 10, 2016

(51) Int. Cl.

| G01R 31/02 | (2006.01) |
|---|---|
| G01R 31/327 | (2006.01) |
| H01H 9/16 | (2006.01) |
| H01H 71/04 | (2006.01) |
| H01H 73/12 | (2006.01) |
| G01P 15/00 | (2006.01) |

(52) U.S. Cl.
CPC ............ *G01R 31/327* (2013.01); *G01P 15/00* (2013.01); *H01H 9/167* (2013.01); *H01H 71/04* (2013.01); *H01H 73/12* (2013.01); *H01H 2071/048* (2013.01)

(58) Field of Classification Search
USPC .................................. 324/424; 361/88, 93.1
See application file for complete search history.

(56) References Cited

U.S. PATENT DOCUMENTS

| 4,706,073 A | 11/1987 | Vila Masot | |
|---|---|---|---|
| 6,172,428 B1 * | 1/2001 | Jordan | H02P 9/04 |
| | | | 290/40 C |
| 2004/0139803 A1 | 7/2004 | Robinson et al. | |
| 2007/0211400 A1 * | 9/2007 | Weiher | H01H 73/12 |
| | | | 361/115 |
| 2013/0021163 A1 | 1/2013 | Watford | |
| 2013/0329331 A1 | 12/2013 | Erger et al. | |
| 2014/0069195 A1 * | 3/2014 | Ledbetter | G01H 17/00 |
| | | | 73/649 |
| 2016/0126717 A1 * | 5/2016 | Valdes | H02H 7/30 |
| | | | 361/93.1 |

FOREIGN PATENT DOCUMENTS

WO    WO 2015/147826 A1 * 10/2015 ............. H01H 73/00

OTHER PUBLICATIONS

Extended European Search Report from corresponding European Application No. 16167851.1 dated Sep. 26, 2016.

* cited by examiner

*Primary Examiner* — Vincent Q Nguyen
(74) *Attorney, Agent, or Firm* — Lando & Anastasi, LLP (57) ABSTRACT

According to one aspect, embodiments herein provide a circuit breaker sensor for use in a panelboard including a plurality of circuit breakers, the circuit breaker sensor comprising a housing having a top portion and a bottom portion, a magnet coupled to the bottom portion and configured to magnetically couple the circuit breaker sensor to a surface of the panelboard, an accelerometer coupled to the magnet and configured to sample movement of the surface via the magnet; and a controller coupled to the accelerometer and configured to identify, based on the samples taken by the accelerometer, whether one of the plurality of circuit breakers in the panelboard has tripped.

19 Claims, 7 Drawing Sheets

CIRCUIT BREAKER SENSOR

BACKGROUND OF INVENTION

Field of the Invention

At least one example in accordance with the present invention relates generally to the monitoring of circuit breakers in a load center or panelboard.

Discussion of Related Art

A load center or panelboard is a component of an electrical supply system which divides an electrical power feed from a power line into different subsidiary circuit branches. Each subsidiary circuit branch may be connected to a different load. By dividing the electrical power feed from the power line into subsidiary circuit branches, the load center may allow a user to individually control and monitor the current, power and energy usage of each load.

SUMMARY

Aspects in accord with the present invention are directed to a circuit breaker sensor for use in a panelboard including a plurality of circuit breakers, the circuit breaker sensor comprising a housing having a top portion and a bottom portion, a magnet coupled to the bottom portion and configured to magnetically couple the circuit breaker sensor to a surface of the panelboard, an accelerometer coupled to the magnet and configured to sample movement of the surface via the magnet; and a controller coupled to the accelerometer and configured to identify, based on the samples taken by the accelerometer, whether one of the plurality of circuit breakers in the panelboard has tripped.

According to one embodiment, upon identifying, based on the surface movement samples taken by the accelerometer, that one of the plurality of circuit breakers in the panelboard has tripped, the controller is further configured to transmit a corresponding notification. In one embodiment, the circuit breaker sensor further comprises an antenna coupled to the controller, wherein the controller is further configure to transmit the corresponding notification wirelessly via the antenna.

According to another embodiment, the circuit breaker sensor further comprises an LED display coupled to the controller and to the top portion of the housing, wherein upon identifying, based on the surface movement samples taken by the accelerometer, that one of the plurality of circuit breakers in the panelboard has tripped, the controller is further configured to operate the LED display to provide an indication that one of the plurality of circuit breakers in the panelboard has tripped. In one embodiment, the circuit breaker sensor further comprises a battery configured to provide DC power to the controller.

According to one embodiment, the circuit breaker sensor further comprises a sound generating device coupled to the controller, wherein upon identifying, based 5 on the surface movement samples taken by the accelerometer, that one of the plurality of circuit breakers in the panelboard has tripped, the controller is further configured to operate the sound generating device to provide an audible alert that one of the plurality of circuit breakers in the panelboard has tripped.

According to another embodiment, the accelerometer is further configured to store the plurality of surface movement samples in a FIFO data queue. In one embodiment, the accelerometer is further configured to compare each of the plurality of surface movement samples with a predetermined threshold level and transmit an interrupt signal to the controller in response to a determination that one of the plurality of surface movement samples exceeds the predetermined threshold level. In another embodiment, in response to receiving the interrupt signal, the controller is configured to read out at least a portion of the plurality of surface movement samples stored in the FIFO data queue of the accelerometer and analyze the at least a portion of the plurality of surface movement samples to determine if the at least a portion of the plurality of surface movement samples indicates that a circuit breaker in the panelboard has tripped.

According to one embodiment, the controller is coupled to the accelerometer via an SPI bus, and wherein the controller is configured to read out the at least a portion of the plurality of surface movement samples from the FIFO data queue of the accelerometer via the SPI bus. In another embodiment, the controller is further configured to determine that the at least a portion of the plurality of surface movement samples indicates that a circuit breaker in the panelboard has tripped in response to identifying that the at least a portion of the plurality of surface movement samples indicates a sudden change in motion followed by a relatively fast return to a stable level. In one embodiment, the circuit breaker sensor further comprises a magnet mount, wherein the accelerometer is coupled to the magnet via the magnet mount.

Another aspect in accord with the present invention is directed to a method for detecting a tripped circuit breaker in a panelboard comprising coupling an accelerometer to a surface of the panelboard, monitoring, with the accelerometer, vibrations in the surface of the panelboard, analyzing, with a controller coupled to the accelerometer, the vibrations to determine if the vibrations indicate that a circuit breaker in the panelboard has tripped, and providing a notification in response to a determination that the vibrations in the surface of the panelboard indicate that a circuit breaker in the panelboard has tripped.

According to one embodiment, coupling an accelerometer to a surface of the panelboard includes attaching the accelerometer to the surface of the panelboard with at least one magnet. In one embodiment, monitoring vibrations with the accelerometer includes sampling movement of the surface of the panelboard. In another embodiment, the method further comprises storing a plurality of surface movement samples in a data queue.

According to another embodiment, the method further comprises comparing, with the accelerometer, each of the plurality of surface movement samples with a predetermined threshold level, and transmitting an interrupt signal to the controller in response to determining that one of the plurality of surface movement samples exceeds the predetermined threshold level. In one embodiment, analyzing the vibrations with the controller includes receiving, with the controller, the interrupt signal, reading out, with the controller in response to receiving the interrupt signal, at least a portion of the plurality of surface movement samples stored in the data queue, and analyzing, with the controller, the at least a portion of the plurality of surface movement samples to determine if the at least a portion of the plurality of surface movement samples indicates that a circuit breaker in the panelboard has tripped.

According to one embodiment, analyzing the at least a portion of the plurality of surface movement samples includes identifying that the at least a portion of the plurality of surface movement samples indicates a sudden change in motion followed by a relatively fast return to a stable level, and determining, in response to identifying, that the at least a portion of the plurality of surface movement samples indicates that a circuit breaker in the panelboard has tripped.

At least one aspect in accord with the present invention is directed to a circuit breaker sensor for use in a panelboard including a plurality of circuit breakers, the circuit breaker sensor comprising a housing having a top portion and a bottom portion, a magnet coupled to the bottom portion and configured to magnetically couple the circuit breaker sensor to a surface of the panelboard, and means for monitoring vibrations in the surface of the panelboard, identifying when the vibrations indicate that a circuit breaker in the panelboard has tripped, and providing a notification when a tripped circuit breaker in the panelboard is identified.

BRIEF DESCRIPTION OF DRAWINGS

The accompanying drawings are not intended to be drawn to scale. In the drawings, each identical or nearly identical component that is illustrated in various FIGs. is represented by a like numeral. For purposes of clarity, not every component may be labeled in every drawing. In the drawings.

DETAILED DESCRIPTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, a load center or panelboard is a component of an electrical supply system which divides an electrical power feed from a power line into different subsidiary circuit branches. Typically, each circuit branch is coupled to the power line via a circuit breaker. Each circuit breaker is configured to automatically open and prevent current in a circuit branch if an overload or short circuit is detected in the circuit branch.

In conventional load centers or panelboards, when a circuit breaker of a circuit branch opens (e.g., due to an overload or short circuit detected in the corresponding circuit branch), the circuit breaker does not provide any external notification (e.g., a signal to a controller) that the circuit breaker has opened. Accordingly, a user or operator of the load center or panelboard may not be aware when a circuit breaker of a circuit branch has tripped. The user or operator may be able to deduce that a specific circuit breaker of a circuit branch has tripped by observing that loads coupled to the corresponding circuit branch have failed and then inferring that the circuit breaker of the circuit branch has failed. However, there may be multiple possible panels, the panels may be difficult to access or locked, and the locations of the panels may be unknown such that the identification process to actually locate the tripped circuit breaker may be time consuming.

Embodiments described herein provide a relatively inexpensive and easily installed sensor that detects when a circuit breaker within a load center or panelboard has tripped and transmits a notification indicating as such. Upon receiving a notification from the sensor that a circuit breaker within a specific panelboard has tripped, a user or operator can quickly identify the panelboard including the tripped circuit breaker and examine the identified panelboard to determine if the circuit breaker should be reset or some other corrective measure taken.

Figure 1A:
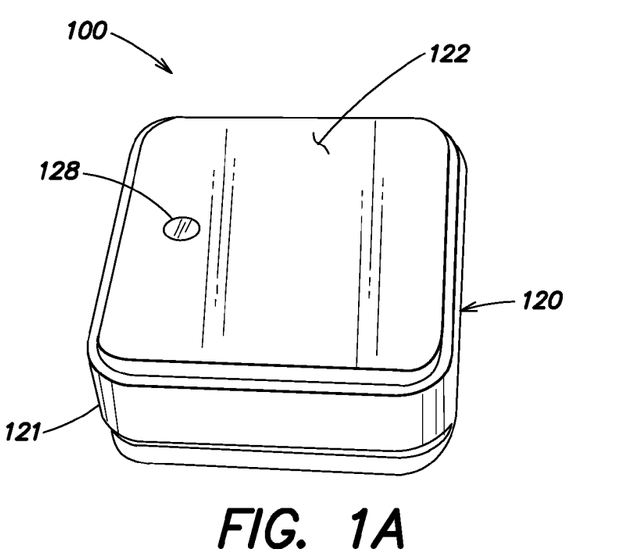
FIG. 1A is a diagram illustrating a front view of a circuit breaker sensor in accordance with aspects of the present invention.
Figure 1B:
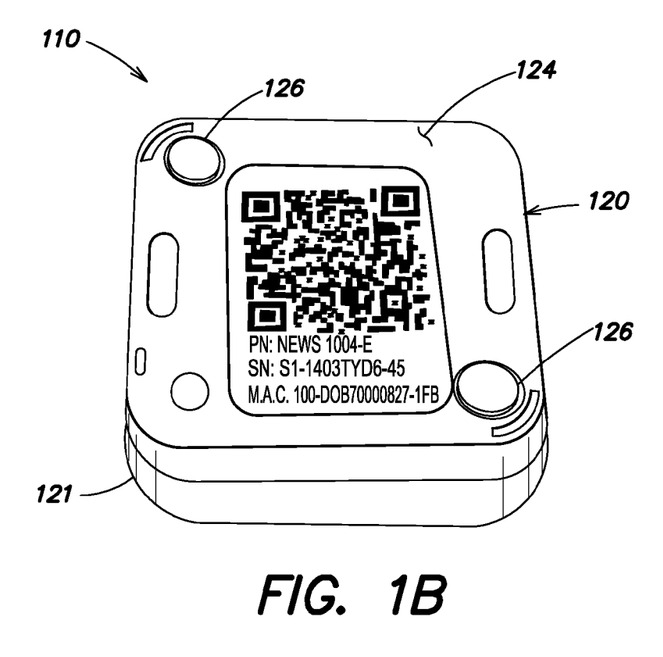
FIG. 1B is a diagram illustrating a back view of a circuit breaker sensor in accordance with aspects of the present invention.
Figure 1C:
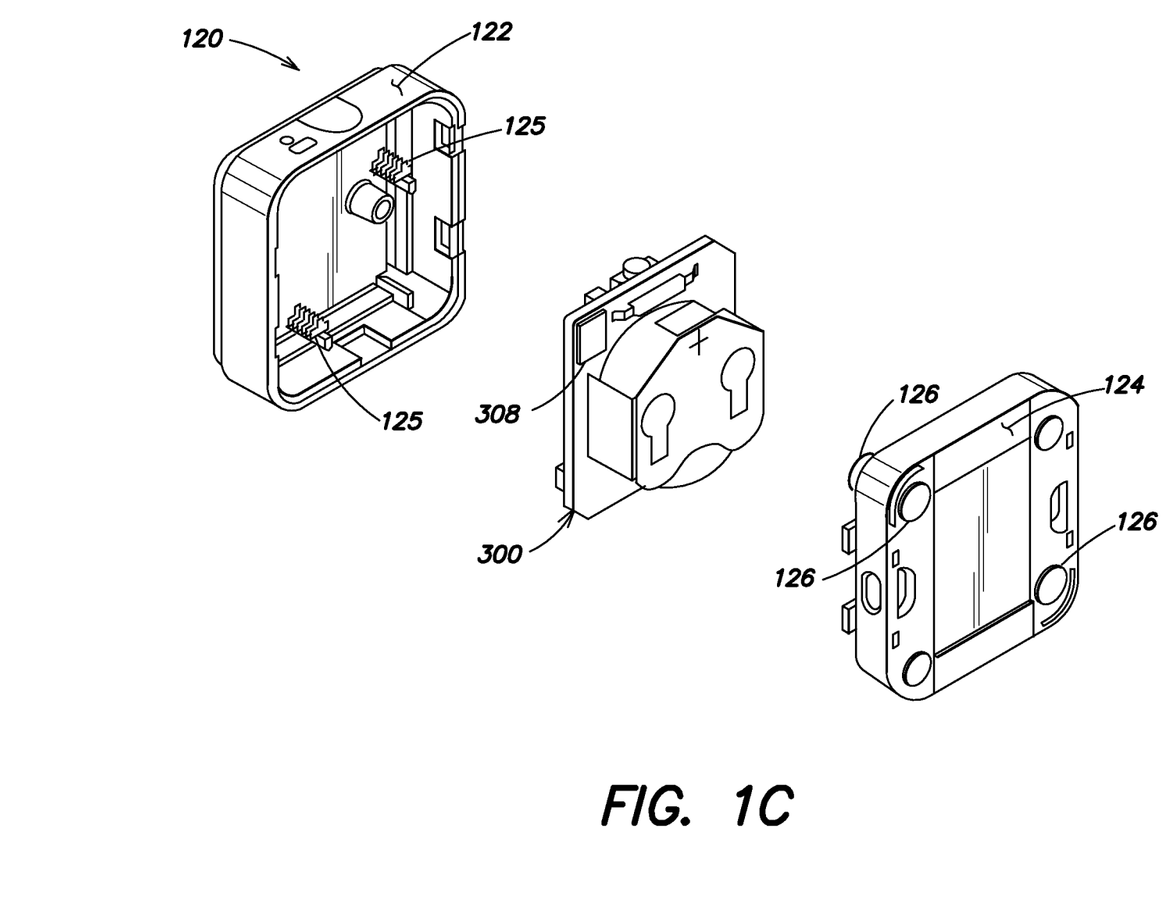
FIG. 1C is an exploded view diagram illustrating a circuit breaker sensor in accordance with aspects of the present invention.
Figure 1D:
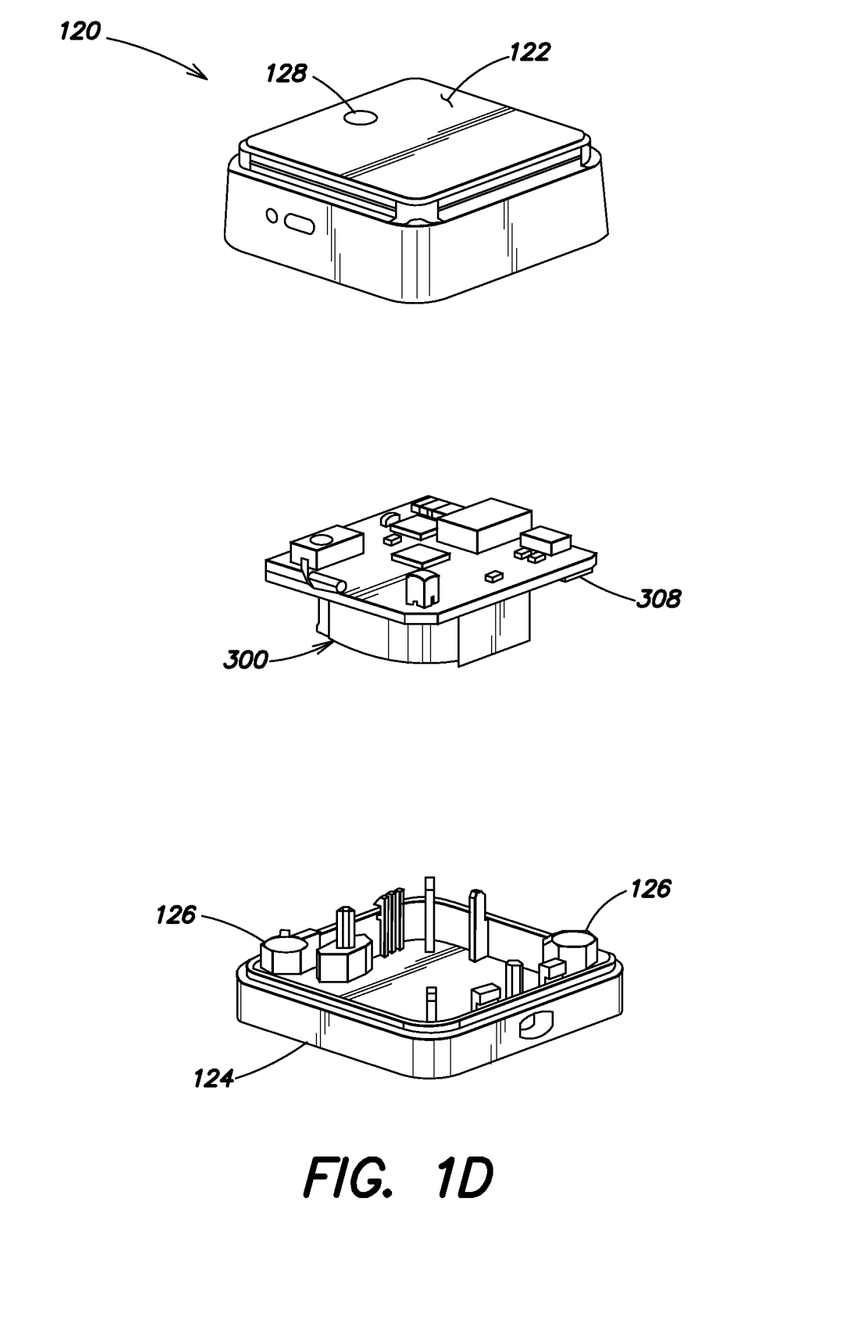
FIG. 1D is another exploded view diagram illustrating a circuit breaker sensor in accordance with aspects of the present invention.
Figure 1E:
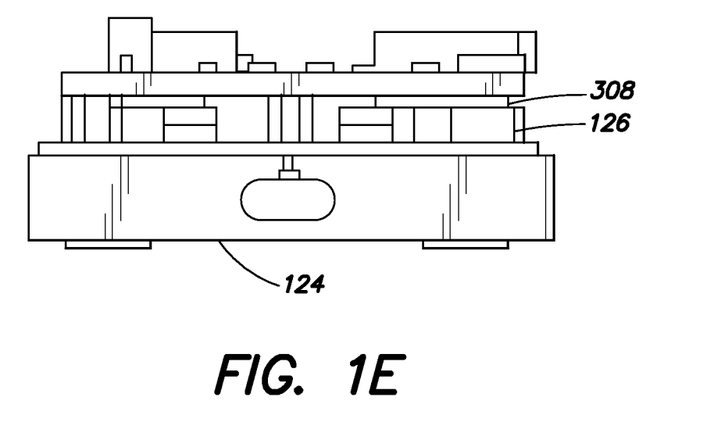
FIG. 1E is a side view diagram illustrating a circuit breaker sensor in accordance with aspects of the present invention.

FIG. 1A is a diagram illustrating a front view 100 of a circuit breaker sensor 120 according to at least one embodiment of the current invention, FIG. 1B is a diagram illustrating a back view 110 of the circuit breaker sensor 120 according to at least one embodiment of the current invention, FIG. 1C is an exploded view diagram illustrating a circuit breaker sensor in accordance with aspects of the present invention, FIG. 1D is another exploded view diagram illustrating a circuit breaker sensor in accordance with aspects of the present invention, and FIG. 1E is a side view diagram illustrating a circuit breaker sensor in accordance with aspects of the present invention. The circuit breaker sensor 120 includes a housing 121 having a top portion 122 and a bottom portion 124. The top portion 122 includes a Light-Emitting Diode (LED) display 128. The bottom portion 124 includes at least one magnet 126. As shown in FIG. 1B, the bottom portion 124 includes two magnets 126;

however, in other embodiments, the bottom portion 124 may include any number of magnets 126.

Figure 2:
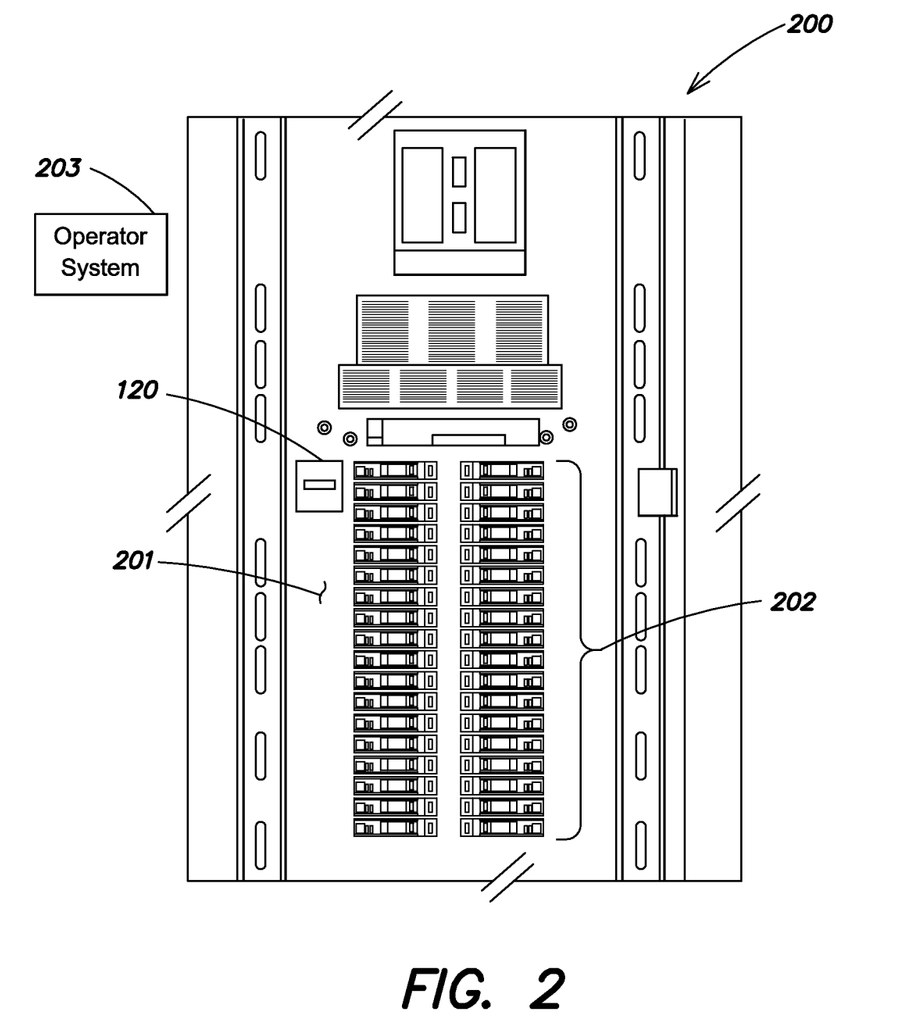
FIG. 2 is a diagram illustrating the connection of a circuit breaker sensor to a panelboard in accordance with aspects of the present invention.

FIG. 2 is a diagram illustrating the connection of the circuit breaker sensor 120 to a panelboard 200 according to at least one embodiment of the current invention. The magnets 126 are configured to magnetically attach the circuit breaker sensor 120 to a metal surface 201 of the panelboard 200. Circuitry 300 within the circuit breaker sensor 120 is configured to sense when a circuit breaker 202 within the panelboard 200 is tripped (i.e., opens) due to an overload or short circuit in a corresponding circuit branch and transmit a notification indicating as such to a user or operator.

In at least one embodiment, an accelerometer 308 is located within the sensor 120 and is mechanically coupled to one of the magnets 126. According to one embodiment, the accelerometer 308 is directly and firmly in contact with one of the magnets 126 such that the accelerometer can sense vibrations in the metal surface 201 to which the magnet 126 is attached. For example, in one embodiment, the housing 121 of the sensor 120 includes ribs 125 that are configured to press the circuitry 300 against the lower portion 124 when the upper portion 122 and lower portion 124 are combined (as shown in FIGS. 1A and 1B). In this way, the accelerometer 308 (located on the circuitry 300) is directly and firmly pressed against a magnet 126 (as shown in FIG. 1E). In other embodiments, the accelerometer 308 may be coupled differently to the magnet 126 such that the accelerometer 308 can sense vibrations in a metal surface to which the magnet is attached.

The accelerometer senses movement (i.e., vibrations) in the metal surface 201 (i.e., through the magnet 126). When a circuit breaker 202 trips, the opening of the circuit breaker 202 sends a shockwave through the panelboard 200 which causes the metal surface 201 to vibrate. If the accelerometer senses vibrations in the metal surface 201 that exceed a predetermined threshold and correspond to a known shock wave having characteristics typically caused by the opening of a circuit breaker 202, the sensor 120 identifies that a circuit breaker 202 within the panelboard 200 has tripped.

Upon identifying that a circuit breaker 202 in the panelboard 200 has tripped, the sensor 120 provides a notification indicating as such to a user or operator. In one embodiment, the sensor 120 transmits a wireless notification to a system 203 operated by a user. In another embodiment, the sensor 120 transmits a notification signal to a system operated by a user via a hardwired connection. In another embodiment, the sensor 120 may operate the LED display 128 to provide an indication (e.g., light up or change color) that a tripped circuit breaker 202 has been identified. In another embodiment, the sensor 120 may contain a sound generating device (e.g., a beeper) that generates a sound when a tripped circuit breaker 202 has been identified, alerting people in the immediate vicinity or people passing by that the panel requires attention.

Upon receiving the notification from the sensor 120 that a circuit breaker 202 within the panelboard 200 has tripped, a user or operator can quickly examine the panelboard 200 to identify the tripped circuit breaker and take any necessary corrective measures (e.g., reset the tripped circuit breaker). By accurately identifying the panelboard 200 within which a circuit breaker 202 has tripped, the sensor 120 may allow an operator to quickly, and correctly, identify the location of a tripped circuit breaker without requiring the operator to guess at the location of the tripped circuit breaker based on other potentially related information (e.g., the powering down of loads connected to a panelboard).

Figure 3:
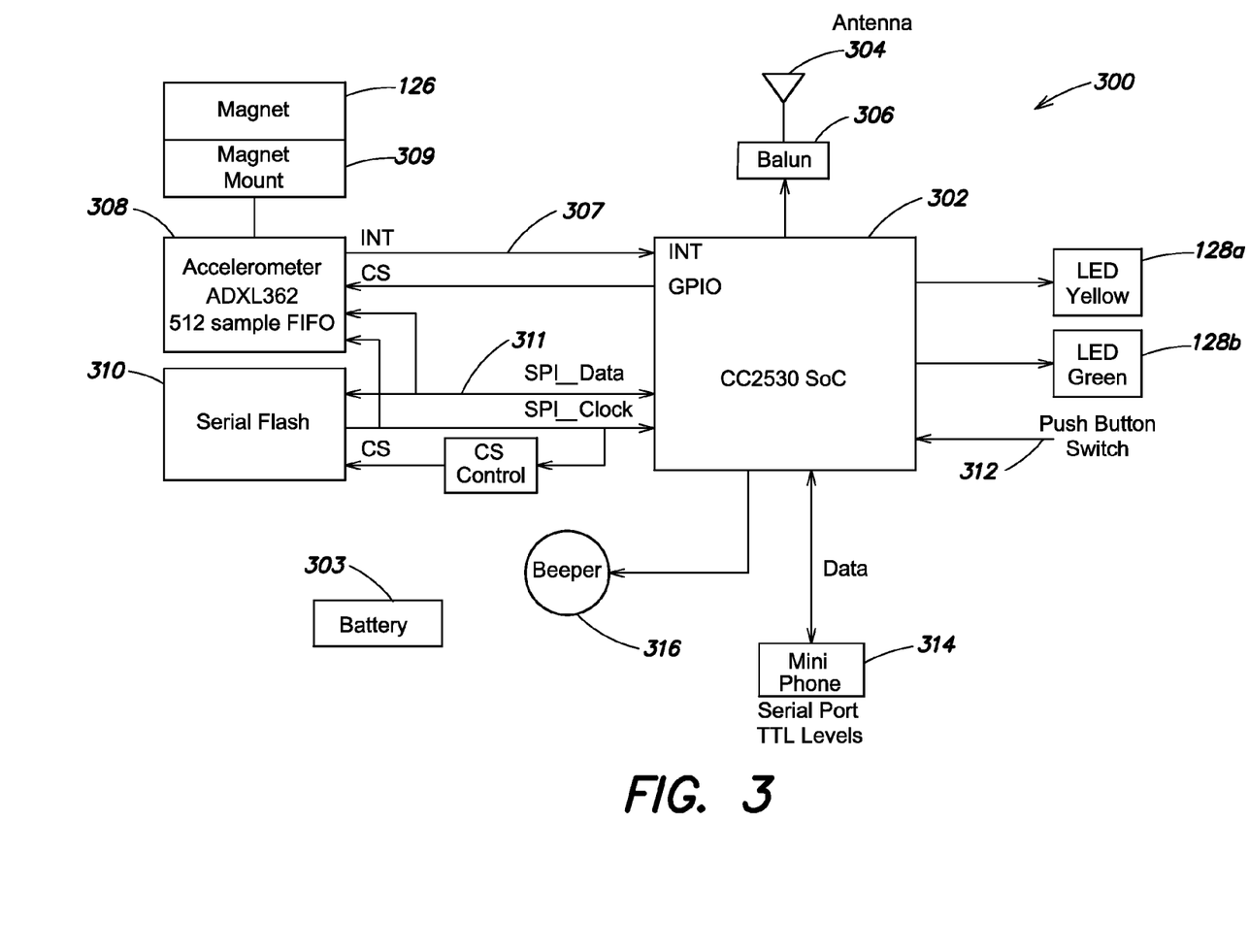
FIG. 3 is a diagram illustrating one embodiment of circuitry within a circuit breaker sensor in accordance with aspects of the present invention.

FIG. 3 is a diagram illustrating one embodiment of the circuitry 300 within the sensor 120. The circuitry 300 includes a controller 302, a battery 303, an antenna 304, an accelerometer 308, and memory 310. In one embodiment, the controller 302 is coupled to the antenna 304 via a balun 306; however, in other embodiments, the controller 302 may be coupled differently to the antenna 304. The accelerometer 308 is mechanically coupled to a magnet (e.g., a magnet 126 in the bottom portion 124 of the sensor 120 as shown in FIG. 1B). In one embodiment, the accelerometer 308 is coupled directly to the magnet 126 (e.g., as discussed above). In another embodiment, the accelerometer 308 is coupled directly to a magnet mount 309 which is a portion of the bottom portion 124 that holds the magnet 126 in place within the bottom portion 124. The accelerometer 308 is also coupled electronically to the controller 302. The memory 310 is coupled to the accelerometer 308 and the controller 302. A yellow LED 128*a* and a green LED 12*b* of the LED display 128 are also both coupled to the controller 302. In one embodiment, the circuitry 300 also includes a beeper 316 coupled to the controller 302. In another embodiment, the circuitry 300 also includes a push button 312 coupled to the controller 302.

The battery 303 is configured to provide DC supply power directly or indirectly to components of the circuitry 300 requiring DC supply power. In one embodiment, the battery 303 is configured to last a relatively long period of time (e.g., 5-7 years); however, in other embodiments, the battery 303 may be configured differently.

When the sensor 120 is affixed, via magnets 126, to a metal surface of a panelboard (e.g., the metal surface 201 of the panelboard 200 shown in FIG. 2) the accelerometer 308 senses movement (i.e., vibrations) in the metal surface 201 (i.e., through the magnet 126 or magnet mount 309 to which it is coupled). In one embodiment, the accelerometer 308 has a relatively high sensitivity (i.e., is sensitive enough to sense movement due to the opening of a circuit breaker). For example, in one embodiment, the accelerometer 308 is an ADXL362 accelerometer manufactured by Analog Devices of Norwood, Mass. and having a sensitivity of 1 milli-g; however, in other embodiments, any other type of accelerometer having any other level of sensitivity appropriate to sense movement/vibrations due to the opening of a circuit breaker may be utilized.

The accelerometer 308 takes samples of the movement of the metal surface 201 at a predetermined rate. In one embodiment, the accelerometer 308 samples the movement of the metal surface 201 between 100 and 400 times per second; however, in other embodiments, any other appropriate sample rate may be utilized. In one embodiment, the accelerometer 308 contains a 512 sample First-In, First-Out (FIFO) data queue which is ready by the controller 302 via a Serial Peripheral Interface (SPI) bus 311; however, in other embodiments, the accelerometer 308 may store the sampled data in any other appropriate way. In one embodiment, the accelerometer 308 may utilize the memory 310 to store the samples or some other information. In one embodiment, the memory 310 is a serial flash memory 310; however, in other embodiments, any other appropriate type of memory device may be utilized.

The accelerometer 308 compares each movement sample with a predetermined threshold level associated with the opening of a circuit breaker. According to one embodiment, the threshold level is determined automatically when the device is first commissioned (i.e., when a commissioning button, such as a push button 312, is first pressed). Upon the device being first commissioned, the accelerometer 308 monitors each axis (the X axis, the Y axis, and the Z axis) of the accelerometer 308 for a period of time (e.g., 5 seconds) and sets the threshold level at a level 0.01 g greater than the highest level seen for each axis. In one embodiment, the threshold level is set to +/−0.100 g in the X axis, +/−1.1 g in the Y axis, and +/−0.050 g in the Z axis; however, in other embodiments, the threshold level may be set at any appropriate level.

If a sample exceeds the predetermined threshold, the accelerometer 308 sends an interrupt signal 307 to the controller 302. In one embodiment, the controller 302 is the CC2530 System-on-Chip manufactured by Texas Instruments of Dallas, Tex.; however, in other embodiments, any other type of appropriate controller may be utilized. In one embodiment, prior to receiving the interrupt signal 307, the controller 302 is in an ultra low power "sleep" mode. Upon receiving the interrupt signal 307 from the accelerometer, the controller 302 "wakes up" and reads/analyzes the samples currently stored in the FIFO data queue of the accelerometer 308. The controller 302 analyzes a portion of the samples over a range starting before and ending after the time at which the threshold was exceeded to determine if the sensed vibrations resemble that of a tripped circuit breaker. For example, in one embodiment, the controller 302 analyzes ten samples before the threshold was exceeded and ten samples after the threshold was exceeded; however, in other embodiments, the controller 302 may analyze any number of samples stored in the FIFO data queue once the threshold is exceeded. While false triggers may consume battery power and shorten the overall life of the battery 303, they are invisible to the operator and do not result in an interrupt signal 307 being transmitted to the controller 302.

Figure 4:
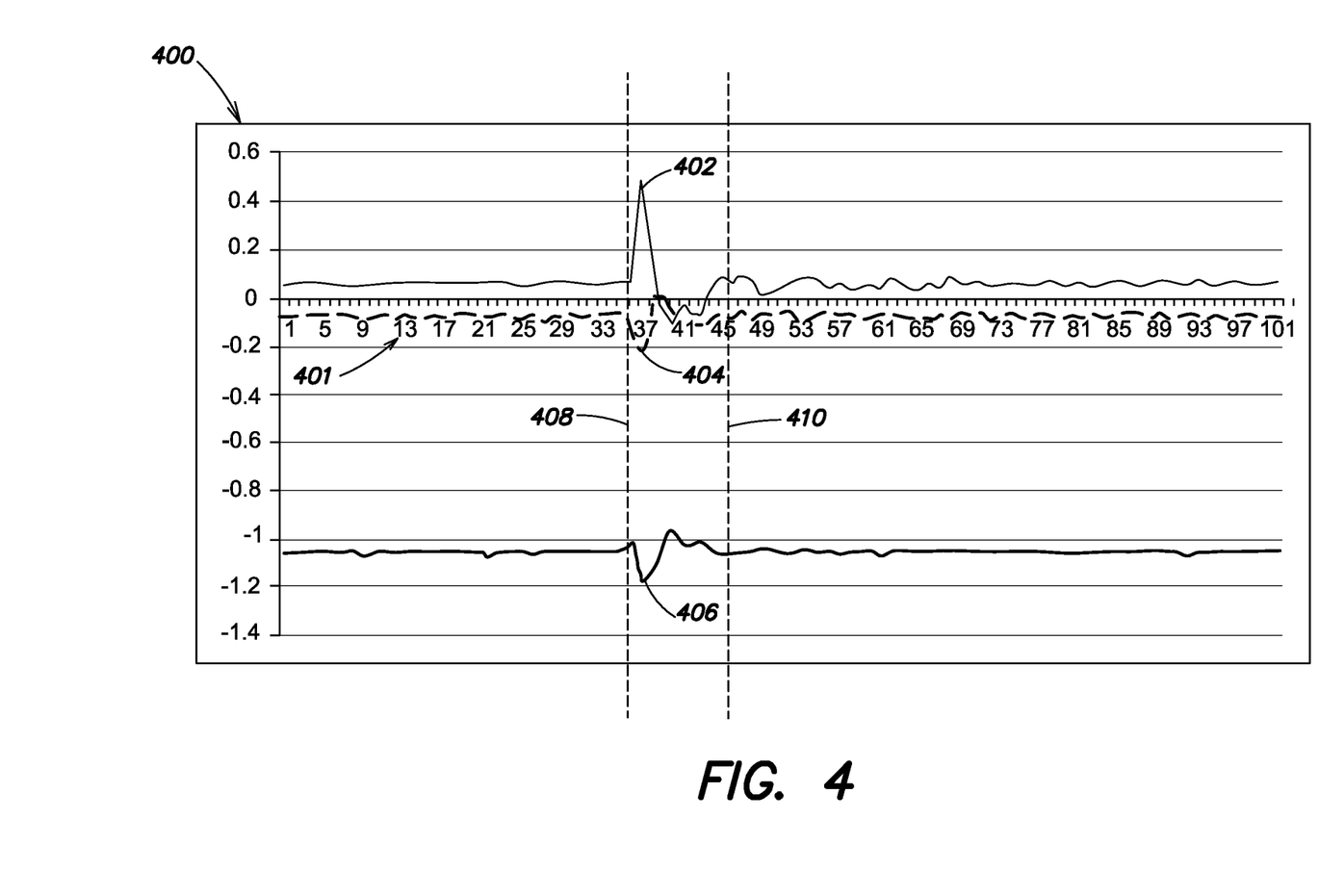
FIG. 4 is a graph illustrating example motion samples taken by an accelerometer in a circuit breaker sensor in accordance with aspects of the present invention.

In at least one embodiment, the controller 302 identifies that the sensed vibrations resemble that of a tripped circuit breaker, if the sampled motion taken around the time that the threshold was exceeded resembles a relatively short pulse having steep increasing and decreasing slopes. For example, FIG. 4 includes a graph 400 illustrating example motion samples 401 (samples 1-101) taken by the accelerometer 308 at a sample rate of 400 Hz with the sensor 120 mounted on a panelboard. The graph 400 includes a first trace 402 illustrating motion (g) samples taken on the Z-axis, a second trace 404 illustrating motion (g) samples taken on the X-axis, and a third trace 406 illustrating motion (g) samples taken on the Y-axis. As shown in FIG. 4, around sample 35 (represented in FIG. 4 by line 408), the accelerometer 308 senses a sudden change in motion (g) along all three axes. However, by around sample 45 (represented in FIG. 4 by line 410), the motion (g) sensed by the accelerometer has returned to a stable level. Such a sudden change (e.g., a spike) in motion (g) followed by a quick return to a stable level indicates to the controller 302 that a circuit breaker has tripped. Alternatively, if the motion (g) sensed by the accelerometer does not return quickly to a stable level but instead shows continuous changes in motion (g), the controller 302 will not identify that a circuit breaker has tripped.

Upon identifying, based on the samples of the accelerometer 308, that a circuit breaker has tripped, the controller 302 transmits, with the antenna 304, a wireless notification to a system 203 that a circuit breaker has tripped in the controller's 302 corresponding panelboard. According to one embodiment, the controller utilizes a short range radio technology (e.g., a Zigbee or Bluetooth based radio technology) to transmit the wireless notification; however, in other embodiments, any other wireless technology (e.g., Wi-Fi) may be utilized to transmit the notification to any Local Area Network (LAN), Personal Area Network (PAN), or Wide Area Network (WAN).

Upon identifying, based on the samples of the accelerometer 308, that a circuit breaker has tripped, the controller 302 may also control the LED display 128 to change color from the green LED 128b (indicating normal operation) to the yellow LED 128a (indicating that a tripped circuit breaker has been sensed. In another embodiment, upon identifying, based on the samples of the accelerometer 308, that a circuit breaker has tripped, the controller 302 may also operate the beeper 316 to generate an audible alert.

Upon receiving the wireless notification from the sensor 120 that a circuit breaker within the sensor's 120 corresponding panelboard has tripped, the system 203 can notify the operator and the operator can quickly examine the corresponding panelboard to identify the tripped circuit breaker and take any necessary corrective measures (e.g., reset the tripped circuit breaker).

According to one embodiment, the sensor 120 also includes a serial port 314 for transmitting data (e.g., motion samples, operational parameters, etc.) to and/or from the controller 302/serial flash memory 310. According to another embodiment, the push-button switch 312 allows the operator to reset the controller back into the normal mode of operation after a tripped circuit breaker has been sensed.

According to other embodiments, the sensor 120 may also include additional circuitry for monitoring other environmental parameters (e.g., temperature and humidity) of a corresponding panelboard.

As discussed above, the sensor 120 includes serial flash memory 310; however, in other embodiments, the sensor 120 may include any other appropriate type of data storage circuit.

As also discussed above, prior to receiving an interrupt signal 307 from the accelerometer 308, the controller 302 is in a "sleep" mode. According to one embodiment, the controller 302 is "awakened" periodically (e.g., every 3 minutes) by an internal "sleep timer" to transmit a "heart beat" signal to the operator system 203 indicating that the controller 302 is still present and functional.

As discussed above, an accelerometer in a sensor is coupled to a surface of a panelboard via a magnet and is configured to sense vibrations in the surface via the magnet. However, in other embodiments, the accelerometer may be coupled securely to a surface of a panelboard via some other appropriate connection device such as a screw tab (e.g., to a mounting screw for the panel cover), a spring clip (e.g., clipped to the edge of the door of the panelboard), or an adhesive such that the accelerometer can sense vibrations in the surface of the panelboard.

As described above, upon identifying, based on the samples of the accelerometer 308, that a circuit breaker has tripped, the controller 302 may transmit a notification to an external system, operate an LED display to change colors, and/or operate a sound generating device to provide an alert. According to one embodiment, the controller 302 may not include circuitry (e.g., the antenna 304) for transmitting a notification to an external system and instead, may only provide a tripped circuit breaker notification to an operator via the LED display 128 and/or sound generating device. According to other embodiments, the sensor 120 may be configured to provide any number of notifications, in any number of different ways, when a tripped circuit breaker is identified.

Embodiments described herein provide a relatively inexpensive and easily installed circuit breaker sensor that detects when a circuit breaker within a load center or panelboard has tripped and transmits a notification indicating as such to a user/operator. The circuit breaker sensor includes an accelerometer that is coupled to a magnet of the sensor that is configured to magnetically attach the sensor to a metal surface of a panelboard. The accelerometer is configured to sense vibrations in the metal surface (via the magnet), analyze the vibrations, and determine when a circuit breaker within the panelboard has tripped based on the analyzed vibrations.

Upon identifying that a circuit breaker within the panelboard has tripped, the circuit breaker sensor transmits a notification to a user/operator indicating that a circuit breaker within the specific panelboard has tripped. Upon receiving a notification from the circuit breaker sensor that a circuit breaker within a specific panelboard has tripped, a user or operator can quickly identify the panelboard including the tripped circuit breaker and examine the identified panelboard to determine if the circuit breaker should be reset or some other corrective measure taken.

By accurately identifying the panelboard within which a circuit breaker has tripped, the sensor may allow a user or operator to quickly, and correctly, identify the location of a tripped circuit breaker without requiring the user or operator to guess at the location of the tripped circuit breaker based on other potentially related information (e.g., the powering down of loads connected to a panelboard or the receipt of signals from loads connected to a panelboard that the loads are powering down).

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A dedicated circuit breaker fault monitor sensor for use in a panelboard including a plurality of circuit breakers, the dedicated circuit breaker fault monitor sensor comprising:
   a housing having a top portion and a bottom portion;
   a magnet coupled to the bottom portion and configured to magnetically couple the dedicated circuit breaker fault monitor sensor to a surface of the panelboard;
   an accelerometer coupled to the magnet and configured to sample movement of the surface via the magnet; and
   a controller coupled to the accelerometer and configured to analyze surface movement samples taken by the accelerometer and determine, based on the analysis of the surface movement samples taken by the accelerometer, that one of the plurality of circuit breakers in the panelboard has tripped.

2. The circuit breaker sensor of claim 1, wherein upon determining, based on the analysis of the surface movement samples taken by the accelerometer, that one of the plurality of circuit breakers in the panelboard has tripped, the controller is further configured to transmit a corresponding notification.

3. The circuit breaker sensor of claim 2, further comprising an antenna coupled to the controller, wherein the controller is further configure to transmit the corresponding notification wirelessly via the antenna.

4. The circuit breaker sensor of claim 1, further comprising an LED display coupled to the controller and to the top portion of the housing, wherein upon determining, based on the analysis of the surface movement samples taken by the accelerometer, that one of the plurality of circuit breakers in the panelboard has tripped, the controller is further configured to operate the LED display to provide an indication that one of the plurality of circuit breakers in the panelboard has tripped.

5. The circuit breaker sensor of claim 1, further comprising a battery configured to provide DC power to the controller.

6. The circuit breaker sensor of claim 1, further comprising a sound generating device coupled to the controller, wherein upon determining, based on the analysis of the surface movement samples taken by the accelerometer, that one of the plurality of circuit breakers in the panelboard has tripped, the controller is further configured to operate the sound generating device to provide an audible alert that one of the plurality of circuit breakers in the panelboard has tripped.

7. The circuit breaker sensor of claim 1, wherein the accelerometer is further configured to store the surface movement samples in a FIFO data queue.

8. The circuit breaker sensor of claim 7, wherein the accelerometer is further configured to compare each of the plurality of surface movement samples with a predetermined threshold level and transmit an interrupt signal to the controller in response to a determination that one of the plurality of surface movement samples exceeds the predetermined threshold level.

9. The circuit breaker sensor of claim 8, wherein in response to receiving the interrupt signal, the controller is configured to read out at least a portion of the plurality of surface movement samples stored in the FIFO data queue of the accelerometer and analyze the at least a portion of the plurality of surface movement samples to determine if the at least a portion of the plurality of surface movement samples indicates that a circuit breaker in the panelboard has tripped.

10. The circuit breaker sensor of claim 9, wherein the controller is coupled to the accelerometer via an SPI bus, and wherein the controller is configured to read out the at least a portion of the plurality of surface movement samples from the FIFO data queue of the accelerometer via the SPI bus.

11. The circuit breaker sensor of claim 9, wherein the controller is further configured to determine that the at least a portion of the plurality of surface movement samples indicates that a circuit breaker in the panelboard has tripped in response to identifying that the at least a portion of the plurality of surface movement samples indicates a sudden change in motion followed by a relatively fast return to a stable level.

12. The circuit breaker sensor of claim 1, further comprising a magnet mount, wherein the accelerometer is coupled to the magnet via the magnet mount.

13. A method for detecting a tripped circuit breaker in a panelboard comprising:
   coupling an accelerometer to a surface of the panelboard;
   sampling, with the accelerometer, movement in the surface of the panelboard;
   analyzing, with a controller coupled to the accelerometer, surface movement samples taken by the accelerometer;
   determining, based on the analysis of the surface movement samples taken by the accelerometer, that a circuit breaker in the panelboard has tripped; and
   providing a fault notification in response to determining that the movement in the surface of the panelboard indicate that a circuit breaker in the panelboard has tripped.

14. The method of claim 13, wherein coupling an accelerometer to a surface of the panelboard includes attaching the accelerometer to the surface of the panelboard with at least one magnet.

15. The method of claim 13, further comprising storing a plurality of the surface movement samples in a data queue.

16. The method of claim 15, further comprising:
comparing, with the accelerometer, each of the plurality of surface movement samples with a predetermined threshold level; and
transmitting an interrupt signal to the controller in response to determining that one of the plurality of surface movement samples exceeds the predetermined threshold level.

17. The method of claim 16, wherein analyzing the surface movement samples with the controller includes:
receiving, with the controller, the interrupt signal;
reading out, with the controller in response to receiving the interrupt signal, at least a portion of the plurality of surface movement samples stored in the data queue; and
analyzing, with the controller, the at least a portion of the plurality of surface movement samples to determine if the at least a portion of the plurality of surface movement samples indicates that a circuit breaker in the panelboard has tripped.

18. The method of claim 17, wherein analyzing the at least a portion of the plurality of surface movement samples includes:
identifying that the at least a portion of the plurality of surface movement samples indicates a sudden change in motion followed by a relatively fast return to a stable level; and
determining, in response to identifying, that the at least a portion of the plurality of surface movement samples indicates that a circuit breaker in the panelboard has tripped.

19. A dedicated circuit breaker fault monitor sensor for use in a panelboard including a plurality of circuit breakers, the circuit breaker sensor comprising:
a housing having a top portion and a bottom portion;
a magnet coupled to the bottom portion and configured to magnetically couple the circuit breaker sensor to a surface of the panelboard; and
means for analyzing movement in the surface of the panelboard, determining, based on the movement sensed in the surface of the panelboard, that a circuit breaker in the panelboard has tripped, and providing a fault notification of a tripped circuit breaker in the panelboard.

* * * * *